(12) United States Patent
Kang (10) Patent No.: US 7,435,534 B2
(45) Date of Patent: Oct. 14, 2008

(54) METHOD FOR MANUFACTURING SEMICONDUCTOR DEVICE

(75) Inventor: Jae Hyun Kang, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 257 days.

(21) Appl. No.: 11/321,532

(22) Filed: Dec. 30, 2005

(65) Prior Publication Data

US 2007/0059649 A1    Mar. 15, 2007

(30) Foreign Application Priority Data

Sep. 13, 2005    (KR) .................. 10-2005-0085161

(51) Int. Cl.
*G03F 7/20* (2006.01)
*G03F 7/26* (2006.01)

(52) U.S. Cl. .................. 430/311; 430/322; 430/323; 430/330; 430/331; 430/327

(58) Field of Classification Search .................. 430/311, 430/327, 330, 331, 322, 323
See application file for complete search history.

(56) References Cited

U.S. PATENT DOCUMENTS 6,797,735 B2 * 9/2004 Nagasuna et al. ............. 521/64
2005/0277756 A1 * 12/2005 Iwabuchi et al. ............. 528/38
2006/0211256 A1 * 9/2006 Takei et al. .................. 438/725

* cited by examiner

*Primary Examiner*—Mark F. Huff
*Assistant Examiner*—Brittany Raymond
(74) *Attorney, Agent, or Firm*—Finnegan, Henderson, Farabow, Garrett, & Dunner L.L.P.

(57) ABSTRACT

A method for manufacturing a semiconductor device effectively removes a solvent of a bottom antireflective coating film is using a porous material so as to prevent acid in a photoresist film from reacting with the solvent during a post exposure baking (PEB) process. The method includes forming a pattern formation layer on a wafer, forming a bottom antireflective coating film containing a solvent, on the pattern formation layer, arranging a porous material layer in contact with the bottom antireflective coating film, absorbing the solvent contained in the bottom antireflective coating film using the porous material layer, forming photoresist film patterns on predetermined portions of the bottom antireflective coating film, etching the bottom antireflective coating film using the photoresist film patterns as masks, and etching the pattern formation layer using the photoresist film patterns as masks to form patterns.

7 Claims, 6 Drawing Sheets

METHOD FOR MANUFACTURING SEMICONDUCTOR DEVICE

This application claims the benefit of the Korean Patent Application No. P2005-0085161, filed on Sep. 13, 2005, which is hereby incorporated by reference in its entirety.

BACKGROUND

1. Technical Field

The present invention relates to a semiconductor device, and more particularly, to a method for manufacturing a semiconductor device, in which a solvent of a bottom antireflective coating film is completely removed using a porous material so as to prevent acid in a photoresist film from reacting with the solvent during a post exposure baking (PEB) process.

2. Discussion of the Related Art

Previously, for an exposure process using a light source in the mid ultra violet (MUV) region of the spectrum, only a photoresist film had been coated on a wafer prior to the wafer undergoing an exposure process.

Recently, a light source such as KrF, in the deep ultra violet (DUV) region of the spectrum, is being used to form a fine pattern. In this case, a bottom anti reflective coating (BARC) film is formed below the photoresist film to solve a problem that occurs when light enters the wafer below the photoresist film. In the case where a DUV light source has a short wavelength, the DUV is reflected on the wafer through the photoresist film and causes interference with the incident light. For this reason, a standing wave is generated, which prevents the photoresist film from forming with a uniform profile. That is, the bottom antireflective coating film serves to prevent the light, which has passed through the photoresist film, from being externally reflected.

The bottom antireflective coating film is mainly used to obtain a uniform critical dimension (CD) depending on a predetermined thickness of the photoresist film pattern. In other words, if no bottom antireflective coating film is used, a scanned KrF laser is only reflected on the wafer and then emitted to the outside through the photoresist film pattern. At this time, an offset reaction generates a standing wave that prevents the photoresist film pattern from forming a uniform vertical profile. Instead, the vertical sides of the photoresist film are formed with the shape of a sine curve, as a result of the generated standing wave. The bottom antireflective coating film is used to prevent the standing wave from occurring and enable the formation of a photoresist film pattern having a substantially uniform vertical profile.

Hereinafter, a related art method for manufacturing a semiconductor device will be described with reference to the accompanying drawings.

Figure 1:
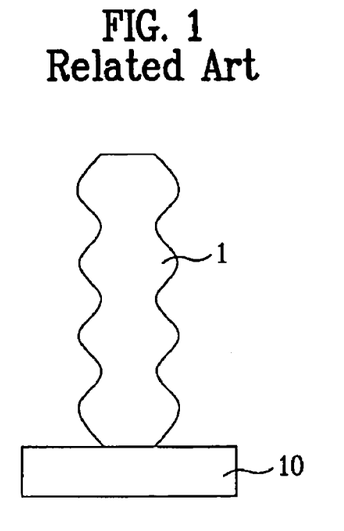
FIG. 1 is a sectional view illustrating a photoresist film coated, exposed and developed on a wafer having no bottom antireflective coating film.

FIG. 1 is a sectional view illustrating a photoresist film coated, exposed and developed on a wafer having no bottom antireflective coating film.

As shown in FIG. 1, a photoresist film is coated on a wafer 10 without a bottom antireflective coating film. The photoresist film is then exposed and developed. Incident light onto the wafer 10 through the photoresist film is reflected on a surface of the wafer 10 and interferes with additional incident light. For this reason, a portion of the pattern is not uniformly exposed, and light is not uniformly irradiated onto a side of the exposed portion. Therefore, a rough side of a photoresist film pattern 1 is formed after the portion of the pattern is developed. This means that the photoresist film pattern 1 has different critical dimensions depending on its thickness. Meanwhile, if the photoresist film is formed of a positive photoresist material, the exposed portion will be removed. If the photoresist film is formed of a negative photoresist material, the exposed portion will remain.

Figure 2:
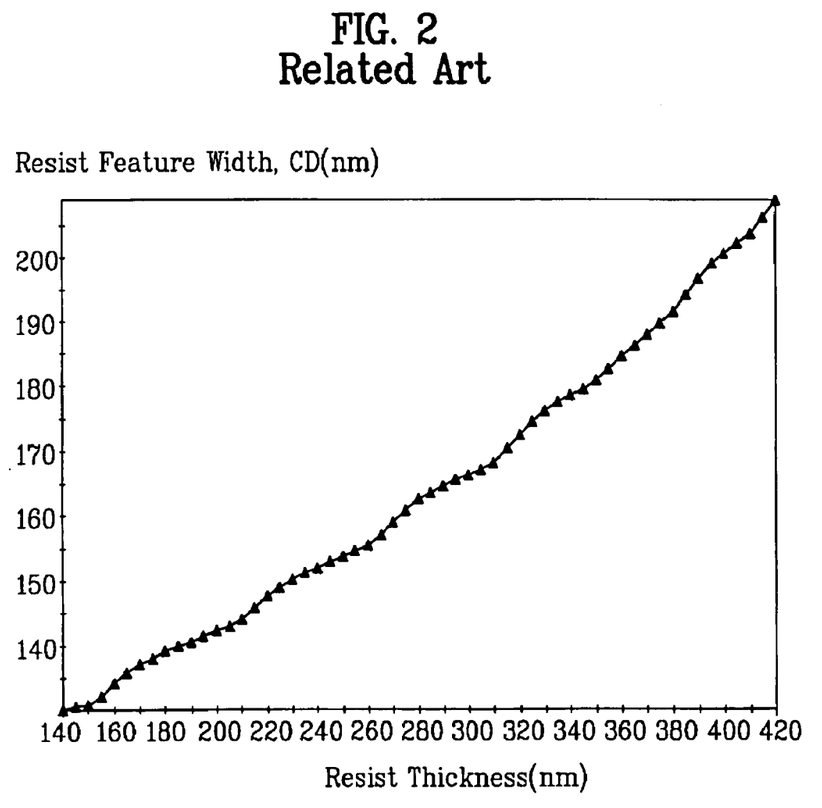
FIG. 2 illustrates variation in the width of a photoresist film depending on its thickness if a bottom antireflective coating film is formed.
Figure 3:
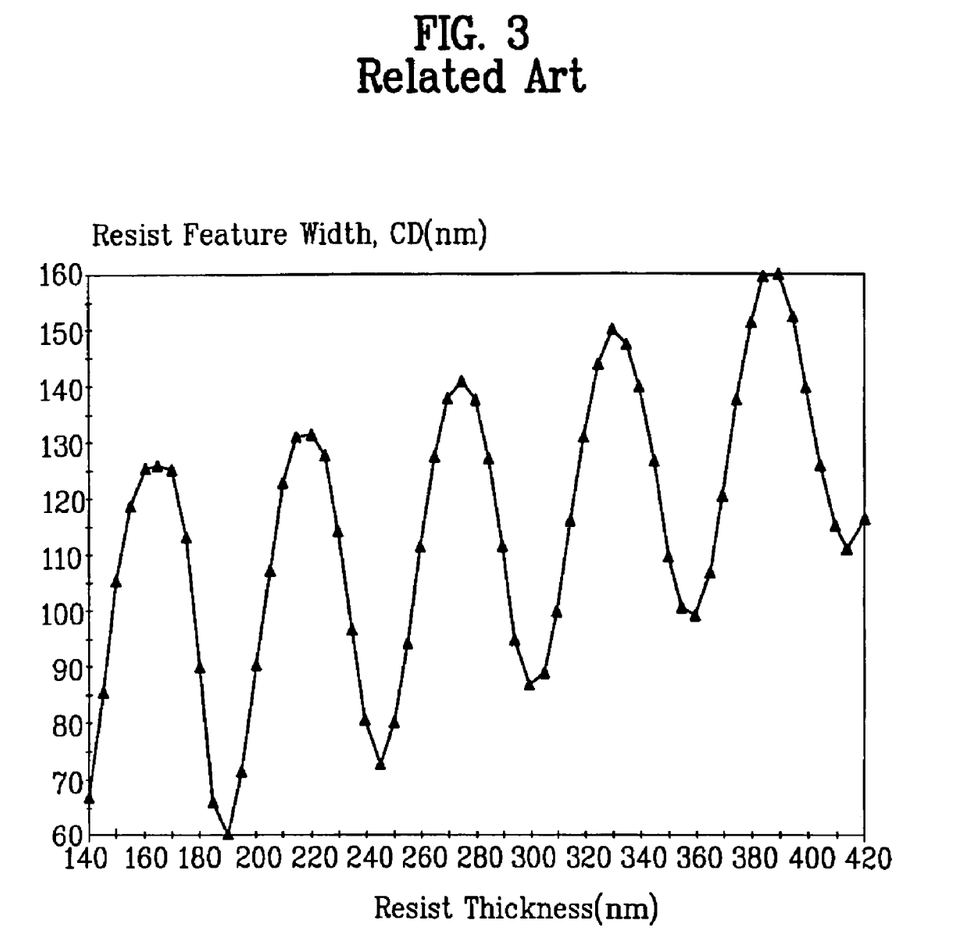
FIG. 3 illustrates variation in the width of a photoresist film depending on its thickness if no bottom antireflective coating film is formed.

FIG. 2 illustrates the variation in the width of the photoresist film depending on its thickness if a bottom antireflective coating film is formed, and FIG. 3 illustrates the variation in the width of the photoresist film depending on its thickness if no bottom antireflective coating film is formed.

As shown in FIG. 2, if the bottom antireflective coating film is formed below the photoresist film, it is noted that the width of the photoresist film pattern formed by exposure and developing processes linearly increases as the thickness (height of the photoresist film formed from on the surface of the wafer) of the photoresist film increases.

However, as shown in FIG. 3, if no bottom antireflective coating film is formed below the photoresist film, it is noted that the width of the photoresist film pattern formed by exposure and developing processes increases at a certain time period but irregularly increases or decreases without linearly increasing within the period as the thickness of the photoresist film increases.

In other words, if the photoresist film pattern is formed by exposure and developing processes without a bottom antireflective coating film, it is noted that a vertical side profile of the photoresist film pattern has a sine curve as shown in FIG. 1.

Furthermore, as shown in FIG. 3, variation of the critical dimensions occur depending on the thickness of the photoresist film within a certain time period when a bottom antireflective coating film is not formed.

For this reason, if a fine pattern having a small design rule is formed, it is desirable to use a bottom antireflective coating film in order to form a photoresist pattern having a uniform profile.

As described further below, the bottom antireflective coating film is formed on the wafer by spin coating.

First, a material for the bottom antireflective coating film is dissolved in a solvent. After the material is coated on the wafer, the wafer is rotated to coat the material thereon at a uniform thickness.

Subsequently, baking is performed to evaporate the solvent. At this time, if the solvent is not completely removed by baking, a proper critical dimension is not obtained. Therefore, in the process of manufacturing a semiconductor device using the bottom antireflective coating film, the solvent should be removed completely by baking.

Figure 4:
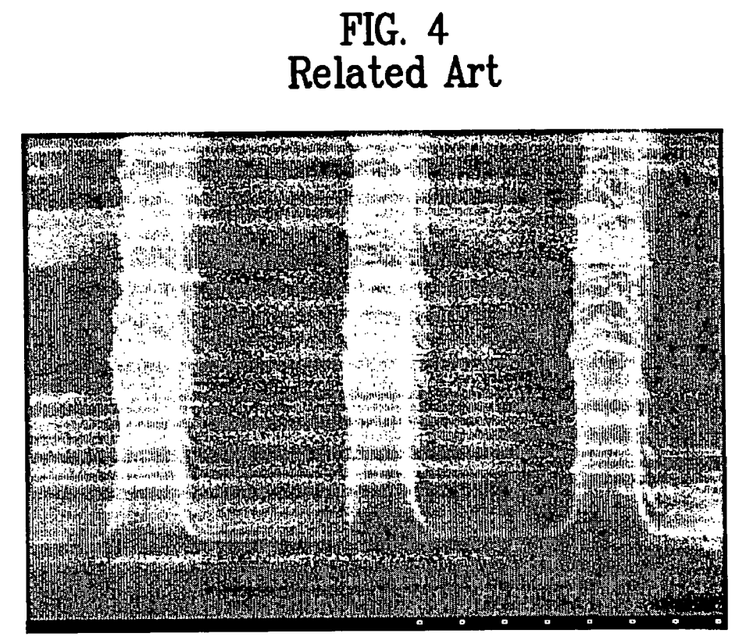
FIG. 4 is a scanning electron microscope (SEM) view illustrating that footing is generated as a solvent remains in a bottom antireflective coating film.
Figure 5:
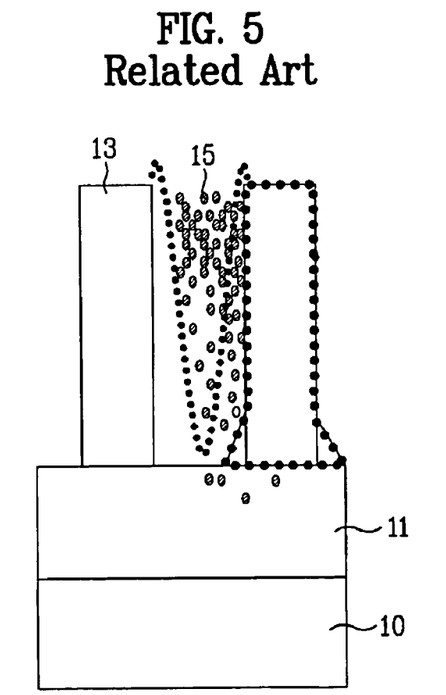
FIG. 5 is a sectional view of FIG. 4.

FIG. 4 is a scanning electron microscope (SEM) view illustrating that footing is generated as the solvent remains in the bottom antireflective coating film, and FIG. 5 is a sectional view of FIG. 4.

In the related art process of removing the solvent included in the bottom antireflective coating film after coating the bottom antireflective coating film, as shown in FIGS. 4 and 5, a hot plate is arranged below the wafer 10 and then heated to evaporate the solvent. Thus, the solvent is removed.

FIGS. 4 and 5 illustrate that footing is generated as the solvent remains in the bottom antireflective coating film.

The photoresist film 13 used for a light source, i.e., KrF, is decomposed by acid $H^+$ 15 contained in a developer during a developing process after an exposure process. However, the bottom antireflective coating film 11 in which the solvent remains is combined with the acid $H^+$ which penetrates into the photoresist film 13 to neutralize the acid $H^+$.

As a result, since the acid component that decomposes the photoresist film 13 is removed, the photoresist film 13 at the neutralized portion remains after the developing process. In this case, the critical dimension at the top of the photoresist film 13 becomes different from that at the bottom thereof, generating the footing as shown in FIG. 4.

The method for manufacturing a semiconductor device has the following problems.

The solvent contained in the bottom antireflective coating film is volatile and is evaporated by heat. Therefore, the solvent can be removed completely after baking the wafer for a sufficient length of time. If baking time is reduced, however, productivity can be improved. Therefore, it is important that the solvent be evaporated completely within a short amount of time so as to prevent degradation of the device from occurring, and to increase productivity and yield. However, in the related art process, the baking time is long.

Furthermore, the photoresist film used for a light source, i.e., KrF, is decomposed by the acid $H^+$ contained in the developer during the developing process after the exposure process. However, the bottom antireflective coating film in which the solvent remains is combined with the acid $H^+$ penetrated into the photoresist film and neutralizes the acid $H^+$.

As a result, since the acid component that decomposes the photoresist film is neutralized in portions in the proximity of the antireflective coating film, the photoresist film at the neutralized portion remains after the developing process. In this case, a problem occurs in that the critical dimension at the top of the photoresist film becomes different from that at the bottom thereof. To solve this problem, it is necessary to completely remove the solvent in the bottom antireflective coating film. A new baking process is required, which can evaporate the solvent within a short time to improve productivity.

SUMMARY

Consistent with the present invention, there is provided a method for manufacturing a semiconductor device, which substantially obviates one or more problems due to limitations and disadvantages of the related art.

Consistent with the present invention, there is further provided a method for manufacturing a semiconductor device, in which a solvent of a bottom antireflective coating film is effectively removed using a porous material so as to prevent acid in a photoresist film from reacting with the solvent during a post exposure baking (PEB) process.

Also consistent with the invention, as embodied and broadly described herein, there is further provided a method for manufacturing a semiconductor device which includes forming a pattern formation layer on a wafer, forming a bottom antireflective coating film containing a solvent, on the pattern formation layer, arranging a porous material layer in contact with the bottom antireflective coating film, absorbing the solvent contained in the bottom antireflective coating film using the porous material layer, forming photoresist film patterns on predetermined portions of the bottom antireflective coating film, etching the bottom antireflective coating film using the photoresist film patterns as masks, and etching the pattern formation layer using the photoresist film patterns as masks to form patterns.

Absorbing the solvent in the bottom antireflective coating film using the porous material layer may be performed by heating the wafer.

The wafer may be heated using a hot plate arranged below the wafer.

The bottom antireflective coating film may be formed by coating a bottom antireflective coating material containing the solvent on the pattern formation layer and rotating the pattern formation layer.

The bottom antireflective coating material may be made of an light-absorbing high polymer.

The solvent may be an organic solvent.

The organic solvent may be made of either ethyl lactate or propylene glycol monomethyl ether acetate (PGMEA).

The porous material layer may be made of a porous oil-absorbing high polymer.

The porous material layer may be made of at least any one of an acryl amide monomer, poly-styrene inducer, ethylene propylene (EPDM) rubber, and polynorborne.

It is to be understood that both the foregoing general description and the following detailed description of the present invention are exemplary and explanatory and are intended to provide further explanation consistent with the invention as claimed.

BRIEF DESCRIPTION OF THE DRAWINGS

The accompanying drawings, which are included to provide a further understanding of the invention and are incorporated in and constitute a part of this application, illustrate embodiments consistent with the invention and together with the description serve to explain the principle of the invention. In the drawings.

DETAILED DESCRIPTION OF THE INVENTION

Reference will now be made in detail to the preferred embodiments consistent with the present invention, examples of which are illustrated in the accompanying drawings. Wherever possible, the same reference numbers will be used throughout the drawings to refer to the same or like parts.

A method for manufacturing a semiconductor device consistent with the present invention will be described with reference to the accompanying drawings.

Figure 6:
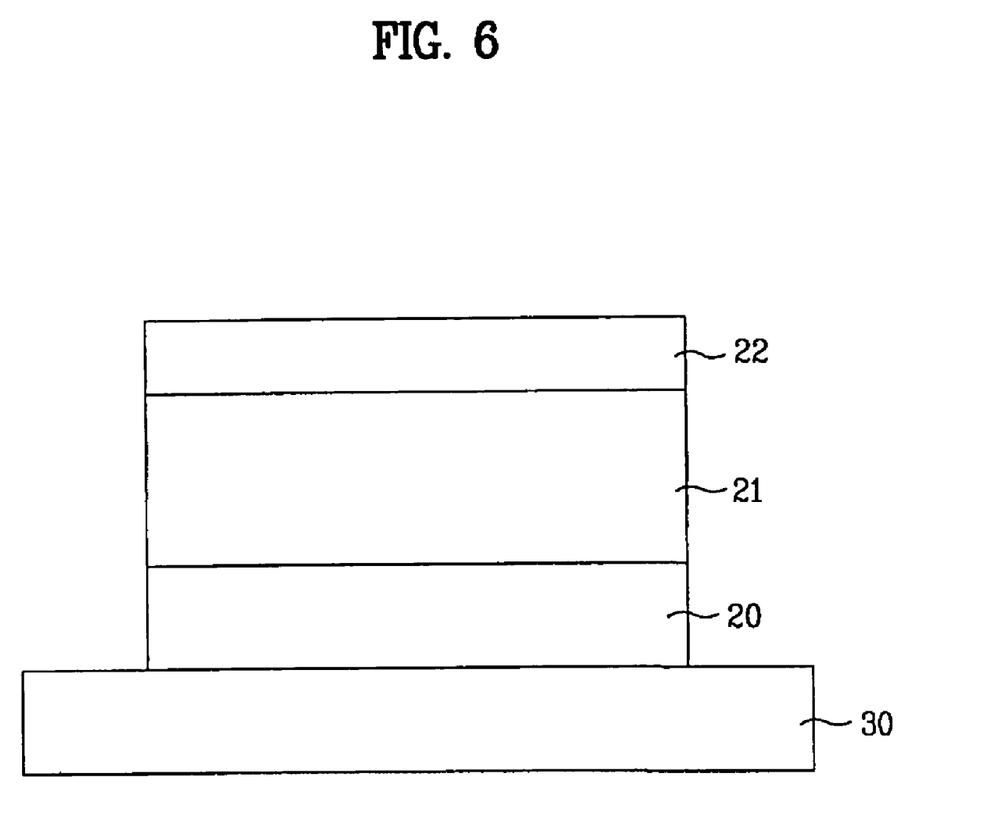
FIG. 6 is a sectional view illustrating a semiconductor device in which a hot plate is used consistent with the present invention.

FIG. 6 is a sectional view illustrating a semiconductor device in which a hot plate is used consistent with the present invention.

As shown in FIG. 6, after a bottom antireflective coating film 21 is formed on a substrate 20, which may be a wafer, a solvent remaining in the bottom antireflective coating film 21 is removed before a photoresist film (not shown) is formed on the bottom antireflective coating film. A porous material layer 22 is deposited to be in contact with the bottom antireflective coating film 21 so that the solvent may be absorbed into a cavity inside the porous material layer 22.

The solvent can be removed more quickly in such a manner that the wafer 20 is arranged on a hot plate 30 and then heated.

When the solvent in the bottom antireflective coating film 21 is effectively removed, the hot plate 30 and the porous material layer 22 are subsequently removed.

Hereinafter, the underlying principles that allow the solvent in the bottom antireflective coating film 21 to be absorbed into the porous material layer 22 will be described.

As is generally known, a typical sponge easily absorbs water. This is because that the sponge has a porous structure. The porous structure means that gaps are formed in a medium. The porous structure has a recessed surface or a surface having holes, and does not have a flat, uniform surface. The porous material layer 22 has a power to absorb liquid using a capillary phenomenon. Also, the porous material serves to prevent the absorbed liquid from being flown down using surface tension.

The capillary phenomenon may be described using the following example. When a glass tube is slightly dipped in a vessel filled with water, the water will be elevated to be higher than the surface of the water. The concept of surface tension may be illustrated by noting that when water drops fall on the surface of a desk, for example, they maintain a round shape without being spread. This occurs because cohesive forces between water molecules are greater than that between water molecules and the surface of the desk. From these principles, one of skill in the art can understand how a porous material such as a sponge can easily absorb water using both the capillary phenomenon and the principle of surface tension.

In the method for manufacturing a semiconductor device consistent with the present invention, if a high polymer porous material is in contact with the bottom antireflective coating film during a baking process, the solvent is removed by both the capillary phenomenon of the porous material, as well as heating.

At this time, a baking temperature (heating temperature by the hot plate) is greater than a cross link temperature of the bottom antireflective coating film. That is, since the bottom antireflective coating film is cured during the baking process, it will not damaged even if it is in contact with the porous material.

The bottom antireflective coating film 21 is formed on the wafer 20 by spin coating. The bottom antireflective coating film 21 exists in a liquefied state in which a high polymer compound is dissolved in an organic solvent. The ratio of the organic solvent to the high polymer compound is about 90% to 10%. Therefore, the bottom antireflective coating film 21 formed on the wafer 20 is in a liquefied state, and is solidified by a predetermined curing process.

A material such as ethyl lactate and propylene glycol monomethyl ether acetate (PGMEA) may be used as the organic solvent. A styrene based material having the same light-absorbing coefficient as that of anthracene may be used as the high polymer compound.

A porous absorptive high polymer may be used as the porous material constituting the porous material layer 22.

An example of the porous material includes a rubber material, such as poly-styrene inducer, ethylene propylene (EPDM), and polynorborne, and an oil-absorbing high polymer material made of polymerization of monomers such as acryl amide monomer and a styrene monomer.

Figure 7A:
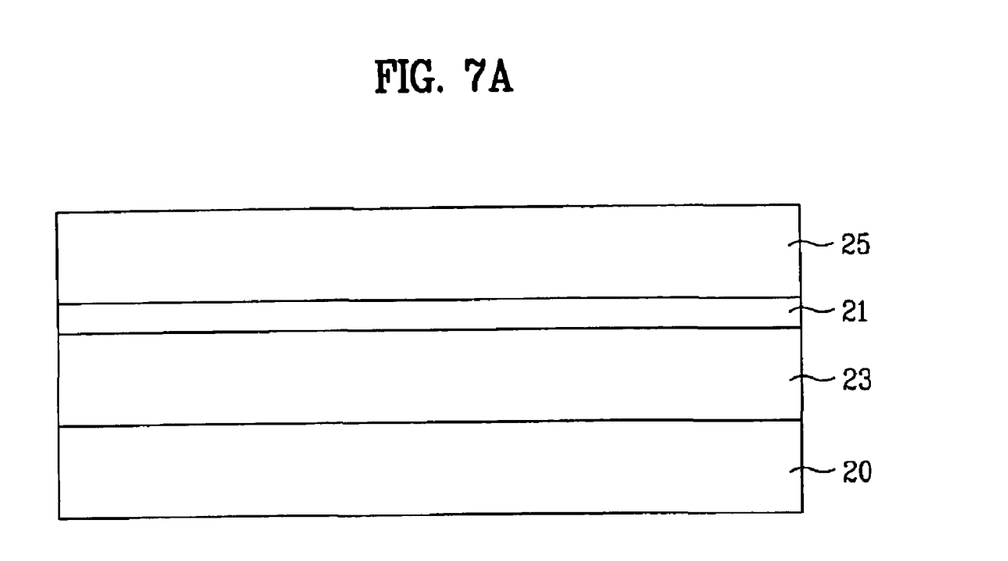
FIG. 7A to FIG. 7D are sectional views illustrating a method for manufacturing a semiconductor device consistent with the present invention.

Meanwhile, a pattern formation layer, such as pattern formation layer 23 shown in FIG. 7A, is formed on the wafer 20 below the bottom antireflective coating film 21. The pattern formation layer is etched using the photoresist film pattern as a mask after the solvent in the bottom antireflective coating film 21 is completely removed.

Hereinafter, the method for manufacturing a semiconductor device using the aforementioned method for removing the solvent in the bottom antireflective coating film will be described.

FIG. 7A to FIG. 7D are sectional views illustrating a method for manufacturing a semiconductor device consistent with the present invention.

As shown in FIG. 7A, a pattern formation layer 23 is deposited on an entire surface of a wafer 20.

Subsequently, after a bottom antireflective coating film 21 is coated on the pattern formation layer 23, a hot plate, such as hot plate 30 shown in FIG. 6, is arranged below the wafer 20. A porous material layer (not shown, see reference number 22 of FIG. 6) is heated in contact with the bottom antireflective coating film 21 so as to evaporate the solvent in the bottom antireflective coating film 21.

Then, the porous material layer 22 is removed from the surface of the bottom antireflective coating film 21.

A photoresist film 25 is subsequently deposited on the entire surface of the bottom antireflective coating film 21.

Figure 7B:
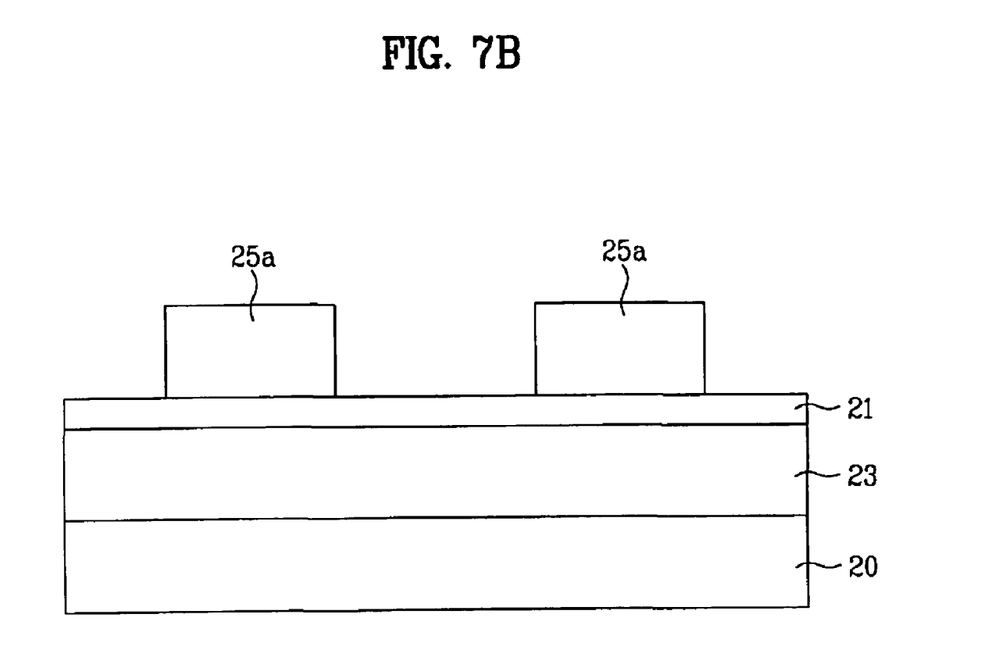

As shown in FIG. 7B, the photoresist film 25 is exposed and developed to form photoresist film patterns 25a on predetermined portions of the bottom antireflective coating film 21.

Figure 7C:
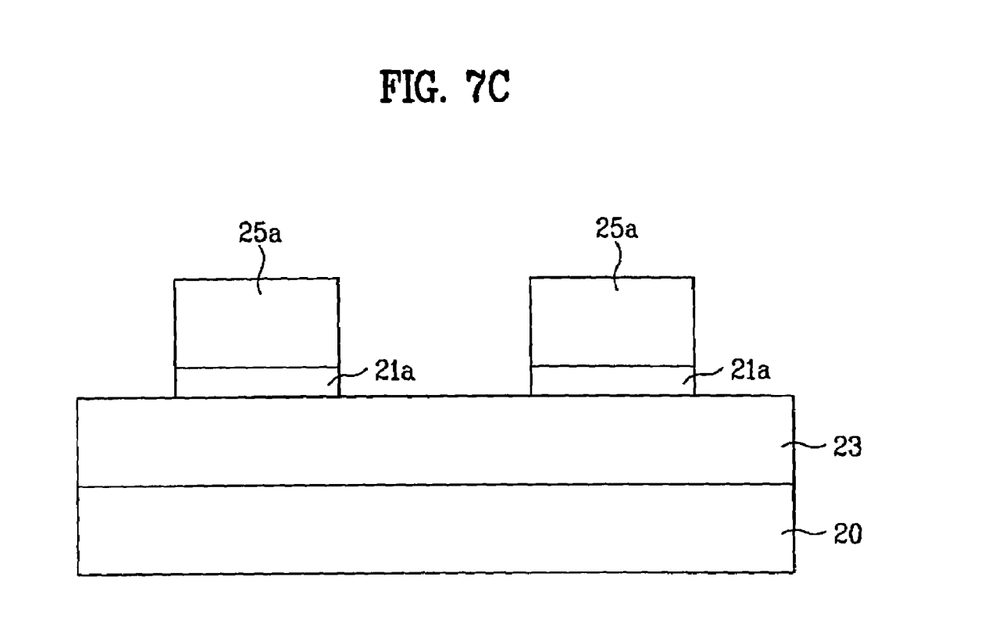

As shown in FIG. 7C, the bottom antireflective coating film 21 is etched using the photoresist film patterns 25a as masks to form bottom antireflective coating film patterns 21a.

Figure 7D:
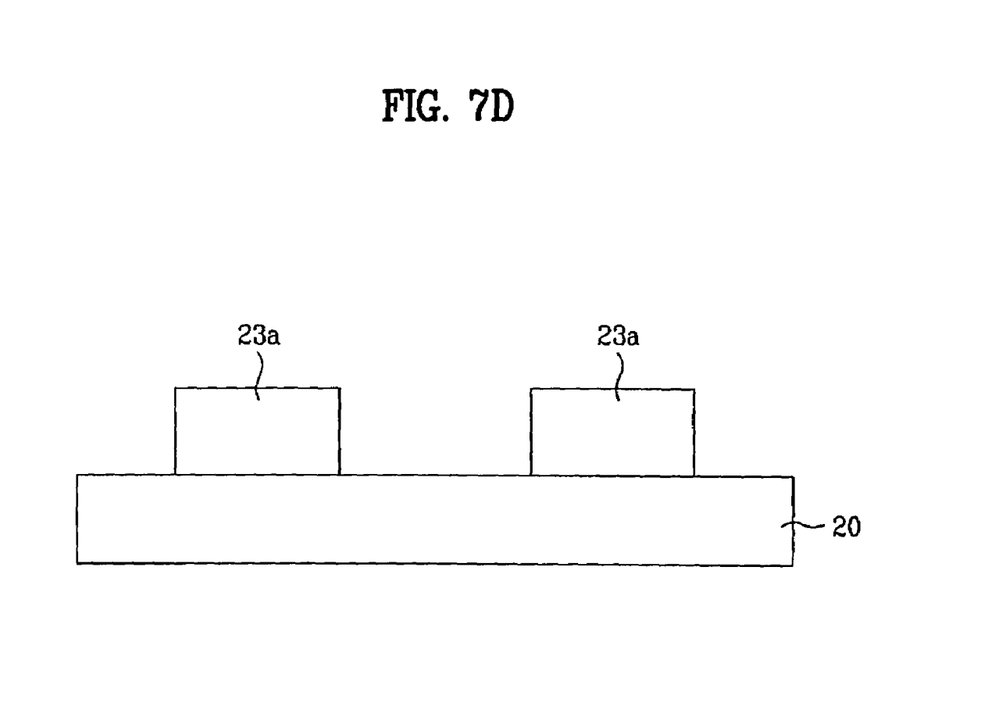

As shown in FIG. 7D, the pattern formation layer 23 is etched using the photoresist film patterns 25a as masks to remain only in portions corresponding to the photoresist film patterns 24a, so that patterns 23a are formed.

The patterns may form, for example, poly gates. In addition to the poly gates, predetermined material layers required for etching are used as the patterns.

If the method for removing the solvent in the bottom antireflective coating film is used to manufacture the semiconductor device, the solvent in the bottom antireflective coating film can be effectively removed within a short time. Therefore, since the solvent does not remain in the bottom antireflective coating film, it is possible to form the photoresist film patterns having uniform critical dimension after the developing process.

As described above, the method for manufacturing a semiconductor device consistent with the present invention has the following advantages.

First, it is possible to solve a problem wherein a photoresist film fails to properly develop due to a reaction between the solvent remaining in the bottom antireflective coating film and the acid of the developer. That is, the porous material layer in contact with the bottom antireflective coating film may be used to remove the solvent in the bottom antireflective coating film, and the wafer is heated using the hot plate to evaporate the solvent. Thus, it is possible to improve evaporating speed and efficiency of the solvent using the capillary phenomenon and surface tension of the porous material layer.

Second, since the solvent in the bottom antireflective coating film is effectively removed, it is possible to prevent acid in the developer from reacting with any otherwise remaining solvent during the developing process after the photoresist film is coated on the bottom antireflective coating film.

Finally, since the solvent is removed within a short time, it is possible to reduce the cost, thereby improving yield.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing a semiconductor device comprising:
    forming a pattern formation layer on a substrate;
    forming a bottom antireflective coating film containing a solvent on the pattern formation layer;
    positioning a porous material layer in contact with the bottom antireflective coating film;
    heating the bottom antireflective coating film by positioning a hot plate below the substrate to evaporate the solvent contained in the bottom antireflective coating film;
    absorbing the solvent contained in the bottom antireflective coating film by the porous material layer;
    removing the porous material layer after absorbing the solvent;
    forming photoresist film patterns on predetermined portions of the bottom antireflective coating film;
    etching the bottom antireflective coating film using the photoresist film patterns as masks; and
    etching the pattern formation layer using the photoresist film patterns as masks to form patterns.

2. The method as claimed in claim 1, wherein forming the bottom antireflective coating film comprises coating a bottom antireflective coating material containing the solvent on the pattern formation layer and rotating the pattern formation layer.

3. The method as claimed in claim 1, wherein the bottom antireflective coating material comprises a light-absorbing high polymer.

4. The method as claimed in claim 1, wherein the solvent comprises an organic solvent.

5. The method as claimed in claim 4, wherein the organic solvent comprises ethyl lactate or propylene glycol monomethyl ether acetate (PGMEA).

6. The method as claimed in claim 1, wherein the porous material layer comprises a porous oil-absorbing high polymer.

7. The method as claimed in claim 1, wherein the porous material layer comprises at least one of an acryl amide monomer, poly-styrene inducer, ethylene propylene (EPDM) Rubber, and polynorborne.

* * * * *